(12) United States Patent
Wong et al.

(10) Patent No.: US 6,420,871 B1
(45) Date of Patent: Jul. 16, 2002

(54) MULTIPLE TUNED BIRDCAGE COILS

(75) Inventors: Wai Ha Wong, San Jose; Seiji Unno, Santa Clara; Weston A. Anderson, Palo Alto, all of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/798,322

(22) Filed: Mar. 2, 2001

(51) Int. Cl.⁷ .................................................. G01V 3/00
(52) U.S. Cl. ........................ 324/318; 324/320; 324/322
(58) Field of Search ................................ 324/318, 320, 324/322, 307, 309

(56) References Cited

U.S. PATENT DOCUMENTS

| | | | | |
|---|---|---|---|---|
| 4,694,255 A | | 9/1987 | Hayes ......................... | 324/318 |
| 5,646,531 A | * | 7/1997 | Renz ........................... | 324/318 |
| 6,236,206 B1 | * | 5/2001 | Hartman et al. ............ | 324/300 |
| 6,252,403 B1 | * | 6/2001 | Alsop ......................... | 324/300 |
| 6,359,437 B1 | * | 3/2002 | Barbara et al. ............. | 324/307 |
| 6,369,579 B1 | * | 4/2002 | Riegel ........................ | 324/425 |

OTHER PUBLICATIONS

Article by Vullo, et al., entitled "Experimental Design and Fabrication of Birdcage Resonators for Magnetic Resonance Imaging", published in *Magnetic Resonance in Medicine*, vol. 24, pp. 243–252 (1992).

* cited by examiner

*Primary Examiner*—Edward Lefkowitz
*Assistant Examiner*—Dixomara Vargas
(74) *Attorney, Agent, or Firm*—Bella Fishman

(57) ABSTRACT

A multiple tuned birdcage coil structure has a plurality of birdcage coils arranged coaxially one inside another around a central axis. Each of the birdcage coils has two conductor rings separated along the central axis and a plurality of mutually separated and parallel linearly elongated conductor legs and generates B1 field which rotates around the central axis by a specified twist angle between the two rings. The twist angles of different ones of these birdcage coils are different by an integral multiple of 360 degrees such that the assembled birdcage coils are mutually inductively transparent. Such a multiple tuned birdcage coil structure may be formed by assembling individually prepared single tuned birdcage coils each having a specified twist angle with a cylindrically shaped insulating bodies in between. A double tuned birdcage coil structure with two birdcage coils may be produced by providing a single printed circuit substrate with metallic sheets laminated on an insulating sheet, etching the metallic sheets to form appropriate patterns, rolling the substrate into a cylindrical form and soldering together appropriate portions of ring-forming parts to form conductor rings directly connected to or capacitively coupled to spirally birdcage legs.

19 Claims, 10 Drawing Sheets

MULTIPLE TUNED BIRDCAGE COILS

FIELD OF THE INVENTION

This invention is in the field of nuclear magnetic resonance (NMR) apparatus and relates in particular to multiple tuned birdcage coils, as well as to methods of producing such coils.

BACKGROUND OF THE INVENTION

It has been known to structure a radio-frequency coil in a birdcage form in order to obtain a highly homogeneous magnetic field as described, for example, in U.S. Pat. No. 4,694,255 issued Sep. 15, 1987 to C. Hayes and "Experimental Design and Fabrication of Birdcage Resonators for Magnetic Resonance Imaging" (T. Vullo, et al., Magnetic Resonance in Medicine, 24, 243 (1992)). Birdcage coils are so called because of their general structure having a pair of loop-shaped conductive elements (the "rings") separated in a longitudinal direction and a plurality of conductive segments (the "legs") evenly spaced about the circumference of and interconnecting these two loop-shaped conductive elements. Capacitors are inserted either in the legs for a low-pass coil, or in the rings for a high-pass coil. It has been recognized that a birdcage coil with a large number of legs, or a millipede coil, has increased field homogeneity and that a spiral version of the standard birdcage coil with conductor legs twisted around the circumference instead of extending axially straight demonstrates improved homogeneity. Throughout herein the term "birdcage coil" will be used for birdcage coils of both the so-called "straight kind" with straight legs extending parallel to the central axis and the so-called "spiral kind" with helically spiraling legs. The B1 field generated by such a birdcage coil of a spiral kind rotates around the central axis. The angle by which the B1 field rotates between the two rings will be hereinafter referred to as the "twist angle". The twist angle for a birdcage coil of the straight kind is zero. The twist angle of a birdcage coil of a spiral kind may be either positive or negative, depending on the direction of the spiraling of the legs.

Birdcage coils are generally tuned at a discrete frequency. When two resonance frequencies are required, one of basic approaches would be by way of double tuning a single coil with lumped elements, while another approach would be by single tuning two coils and putting them together. When two coils are put together, say, coaxially one inside the other, however, there arises the problem of inductive coupling between them. It has therefore been an important problem to minimize the interaction between closely arranged coils, or to make them mutually transparent.

SUMMARY OF THE INVENTION

It is therefore an object of this invention to provide a multiple tuned birdcage coil structure having a two or more single-tuned birdcage coils arranged coaxially one inside another with minimized mutual interaction among them.

It is another object of this invention to provide a method of producing such a multiple tuned birdcage coil structure.

It is still another object of this invention to provide methods of producing single tuned birdcage coils and double tuned pairs of such birdcage coils with minimized mutual interaction between them, say, as a step in producing a multiple tuned birdcage coil structures with three or more birdcage coils.

Each of the single-tuned birdcage coils, or millipede coils, to be arranged coaxially one inside another to form a multiple tuned birdcage coil structure embodying this invention may be characterized as having birdcage legs which helically twist around such that the direction of its B1 field rotates by a specified angle (defined above as the twist angle). The twist angles of any two of the assembled individual birdcage coils are different by an integral multiple of 360 degrees. As a specific example, a double tuned birdcage coil structure may be formed by assembling a birdcage coil with straight legs (with twist angle of zero degree) and another with spiraling legs with a twist angle of 360 degrees. Alternatively, two coils with spiraling legs, one with a twist angle of +180 degrees and the other with a twist angle of −180 degrees may be assembled.

Aside from this relationship among the twist angles (which may be zero or non-zero) of the birdcage coils to be assembled, the invention does not impose many requirements as to their types. They may each be of a type with the birdcage legs arranged in an interdigital configuration, of another type with legs protruding from each of the rings towards the other in a radially overlapping positional relationship with respect to the central axis, or of still another type with each of the legs connected to one of the rings at one end and capacitively coupled to the other at the other end. Although a prior art birdcage coil usually has two metallic rings separated along the central axis, two of the birdcage coils which are assembled according to this invention may share a common ring, or a common ring may be capacitively coupled to the legs of two birdcage coils.

Such a multiple tuned birdcage coil structure may be produced by providing a plurality of single tuned birdcage coils with twist angles related as required above and inserting one inside another coaxially. Alternatively, a double tuned birdcage coil structure with only two birdcage coils assembled coaxially one inside the other may be produced as a first step. This may be done by providing a so-called printed circuit substrate with metallic sheets on both surfaces of an insulating sheet, etching the metallic sheets in specified patterns, and then rolling it into a cylindrical form. Each pattern includes a set of plurality of mutually separated and parallel linearly elongated members, and the sets of these elongated members are oriented obliquely to each other such that, as the substrate is rolled, they turn into the legs of two birdcage coils. The patterns are designed such that each of these two coils thus formed has a specified twist angle and that the difference between their twist angles will be an integral multiple of 360 degrees.

BRIEF DESCRIPTION OF THE DRAWINGS

The accompanying drawings, which are incorporated in and form a part of the disclosure, illustrate embodiments of the invention and, together with the description, serve to explain the principles of the invention. In the drawings.

DETAILED DESCRIPTION OF THE INVENTION

Figure 1:
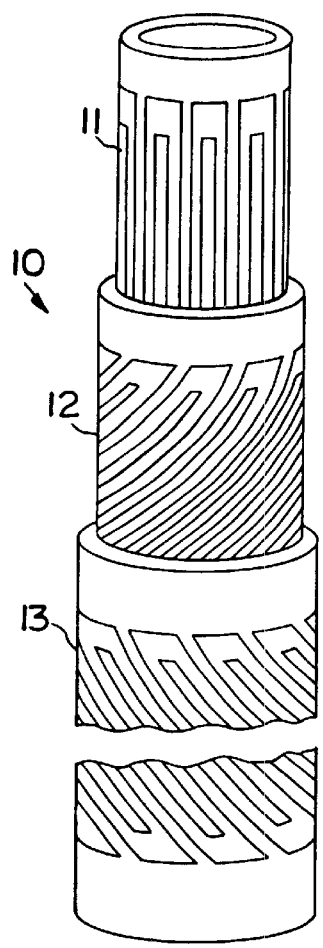
FIG. 1 is a schematic diagonal view of a multiple tuned birdcage coil structure embodying this invention with three birdcage coils before they are assembled one inside another.

The basic principle of the invention is explained first by way of an example. FIG. 1 shows schematically an example of multiple tuned birdcage coil structure 10 embodying this invention, comprising three single tuned birdcage coils (the "innermost" 11, the "middle" 12 and the "outermost" 13), which are to be arranged coaxially one inside another around a central axis although shown for the convenience of disclosure before they are so assembled. Numerals 14 and 15 each indicate a hollow cylindrically shaped insulator body, inserted between the individual bird cage coils 11, 12 and 13 not only to insulate them one from another but also to provide the coil structure 10 an additional overall strength. Each of these three birdcage coils 11, 12 and 13 may be a prior art birdcage coil having two conductive rings separated longitudinally in the direction of the central axis and a large number of conductive linearly elongated legs extending therebetween. For the convenience of description, these two conductive rings will be referred to as the "upper ring" and the "lower ring" without regard to their actual positional relationship in the vertical direction. Those of the legs which protrude from the upper ring and extend generally towards the lower ring without reaching it and those which protrude from the lower ring and extend generally towards the upper ring without reaching it are hereafter respectively referred to as the "downwardly extending legs" and the "upwardly extending legs". The downwardly and upwardly extending legs are arranged alternately around the rings, or interdigitally, evenly spaced therebetween so as not to contact but to be capacitively coupled with each other. The innermost birdcage coil 11 is of a so-called straight kind with its legs extending parallel to the central axis. The middle and outermost birdcage coils 12 and 13 are of a so-called spiral kind, with their legs helically twisted such that the direction of the B1 field generated in operation will rotate azimuthally around the central axis uniformly and by a specified angle (herein referred to as "the twist angle") as one moves from one to the other of the rings. The twist angle is 360 degrees for the middle birdcage coil 12 and is −360 degrees (twisting in opposite direction) for the outermost birdcage coil 13.

The three spiral birdcage coils 11, 12 and 13 with different twist angles are assembled so as to be coaxial and one inside another. Since the twist angle of the middle coil 12 is 360 degrees and the direction of its B1 field rotates by 360 degrees azimuthally around the central axis between the upper and lower rings, as explained above, the total magnetic flux intercepted by the window between the two rings of the innermost coil 11 will sum up to zero. In other words, the current which may be induced in the innermost coil 11 due to the driving of the middle coil 12 will be zero. In still other words, these two coils are orthogonal, meaning that they are inductively not coupled, or are inductively transparent to each other.

Similarly, the outermost coil 13 is also orthogonal to both the innermost coil 11 and the middle coil 12 because its twist angle of −360 degrees is different from those of the innermost and middle coils 11 and 12 by integral multiples of 360 degrees. In summary, all three birdcage coils 11, 12 and 13 of the coil structure 10 of FIG. 1 are mutually orthogonal although they are together multiple tuned.

Although the basic general principle of the invention was explained above by way of only one example, many modifications and variations are possible within the scope of the invention. Firstly, any plural number of birdcage coils may be assembled coaxially although the total number of birdcage coils to be thus assembled for multiple tuning cannot exceed a certain maximum. This is because the length of legs may adversely affect the efficiency of a birdcage coil and hence it is not advisable to include in the assembled structure a spiral coil with a twist angle which is too large. Secondly, although a structure with three spiral birdcage coils with twist angles respectively +360 degrees, −360 degrees and zero degree was used as an example, any of them can in principle be replaced by one with twist angle of any positive or negative multiple of 360 degrees. More generally, none of the plurality of spiral birdcage coils to be assembled together needs to have a twist angle equal to an integral multiple of 360 degrees. If spiral birdcage coils with twist angles which are mutually different by integral multiples of 360 degrees are assembled as described above, they are in principle orthogonal to each other. Since the length of the legs of a birdcage coil may adversely affect its efficiency, or since the efficiency of a birdcage coil is generally affected by the length of its legs, a preferred double tuned birdcage coil structure with a good balance may comprise two spiral birdcage coils with twist angles +180 degrees and −180 degrees.

Although each of the three birdcage coils 11, 12 and 13 in the structure 10 shown in FIG. 1 was described as having two conductor rings from which legs protrude towards each other in an interdigital formation, this is not intended to limit the scope of the invention. Any of the plurality of spiral birdcage coils to be assembled may be structured by arranging the linearly elongated conductor legs extending from each of the two oppositely placed conductor rings not in an interdigital formation as shown in FIG. 1, but, for example, in a radially separated and overlapping positional relationship with respect to the central axis of the generally cylindrical coil, as shown schematically in FIG. 2. Although not shown in FIG. 2 for clarity, the mutually overlapping pairs of conductor legs extending in mutually opposite directions may be separated from each other by a sheet of a dielectric material in between such as a hollow cylindrical body of an insulating material as shown at 14 or 15 in FIG. 1. Coils of this type are advantageous in that the mutually overlapping pairs of conductor legs can more easily control the capacitive coupling therebetween by adjusting the distance along which they overlap.

Figure 2:
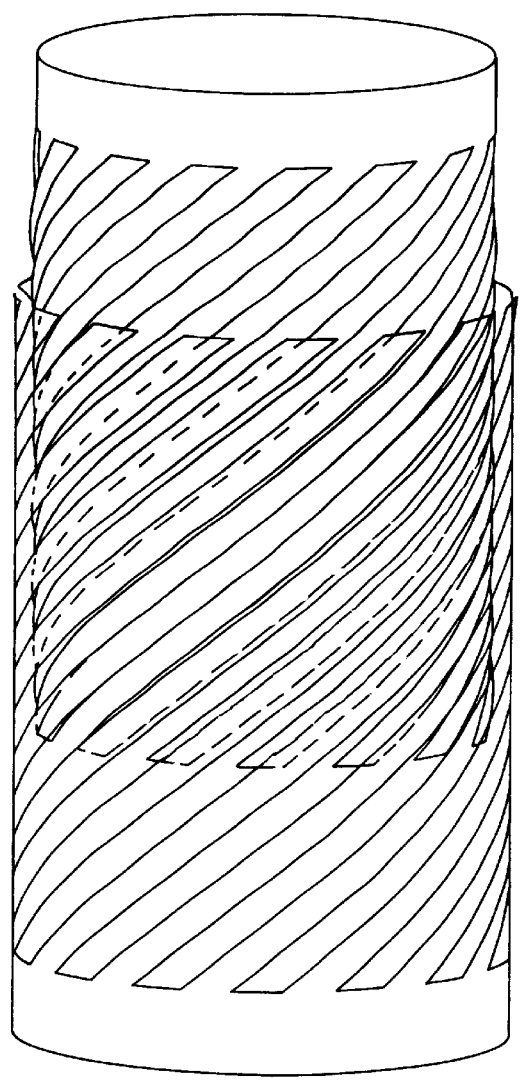
FIG. 2 is a schematic diagonal view of a portion of any of the birdcage coils structured differently to be assembled to form a multiple tuned birdcage coil structure embodying this invention.
Figure 4:
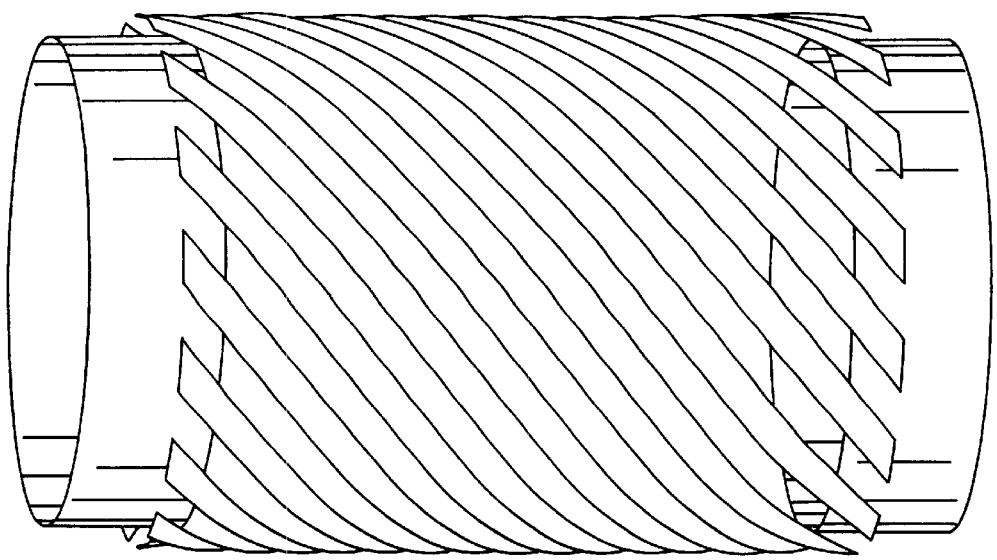
FIG. 4 is a sketch of any of the birdcage coils structured still further differently to be assembled to form a multiple tuned birdcage coil structure embodying this invention.
Figure 3:
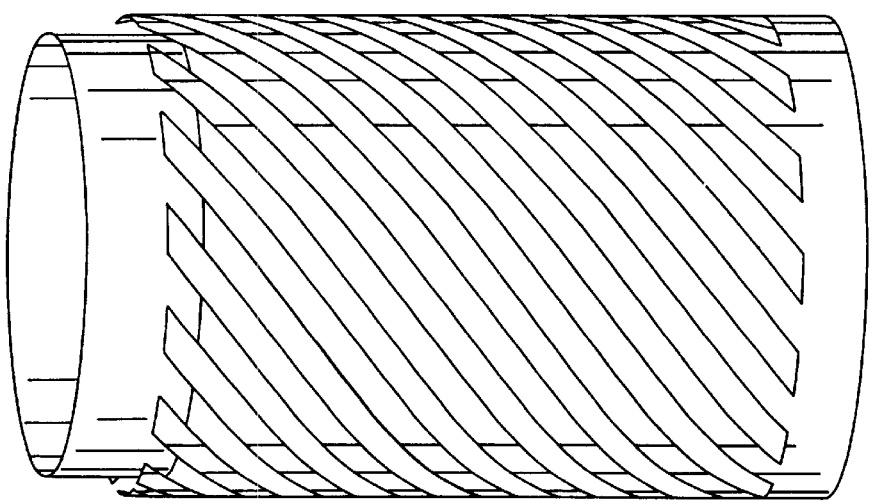
FIG. 3 is a sketch of any of the birdcage coils structured still more differently to be assembled to form a multiple tuned birdcage coil structure embodying this invention.

Any of the spiral birdcage coils to be assembled may be of still another structure, as shown in FIG. 3, with all of the conductor legs connected to one of the conductor rings at one end and extending towards the other of the conductor rings, not contacting it but being capacitively coupled therewith, say, by having a dielectric layer in between. FIG. 4 shows still another manner in which any of the spiral birdcage coils to be assembled may be structured, characterized in that each of the conductor legs extending between the two conductor rings is arranged such that each of its end parts is not in direct contact with the corresponding one of the conductor rings but is capacitively coupled therewith, say, by having a dielectric layer in between. Although coils with straight legs are shown in FIGS. 2, 3 and 4, birdcage coils structured as shown in these figures may be of a kind having a non-zero twist angle with spirally twisted legs.

In FIGS. 1–4, no circuitry for driving the coils is shown for the convenience of disclosure and because such circuitry is well known to persons skilled in the relevant arts.

The coil structure 10 shown in FIG. 1 may be produced by preparing the three single tuned birdcage coils 11, 12 and 13 and the cylindrical insulator bodies 14 and 15, each of the birdcages coils 11, 12 and 13 having a specified twist angle such that their twist angles are different from each other by an integral multiple of 360 degrees, and then assembling them together as shown in FIG. 1 one inside another.

Next, methods of producing double-tuned pairs of birdcage coils embodying this invention will be described. Multiple tuned birdcage coil structures with more than two birdcage coils assembled together can be formed from such a double tuned pair of birdcage coils by using it as a building block, and hence methods of constructing such structures with three or more birdcage coils will not be discussed.

As a first example, consider the portion of the multiple tuned birdcage coil structure 10 shown in FIG. 1 including only the innermost coil 11 with straight legs and the middle spiral coil 12 with legs helically twisted with the twist angle of 360 degrees. This subassembly of the coil structure 10, with the outermost coil 13 removed, may be considered as a double tuned birdcage coil structure serving also as a building block of the coil structure 10 of FIG. 1. A method embodying this invention for forming such a double tuned birdcage coil structure with one straight birdcage coil (with zero twist angle) and one spiral birdcage coil with twist angle of 360 degrees will be explained next with reference to FIGS. 5 and 6.

Figure 5:
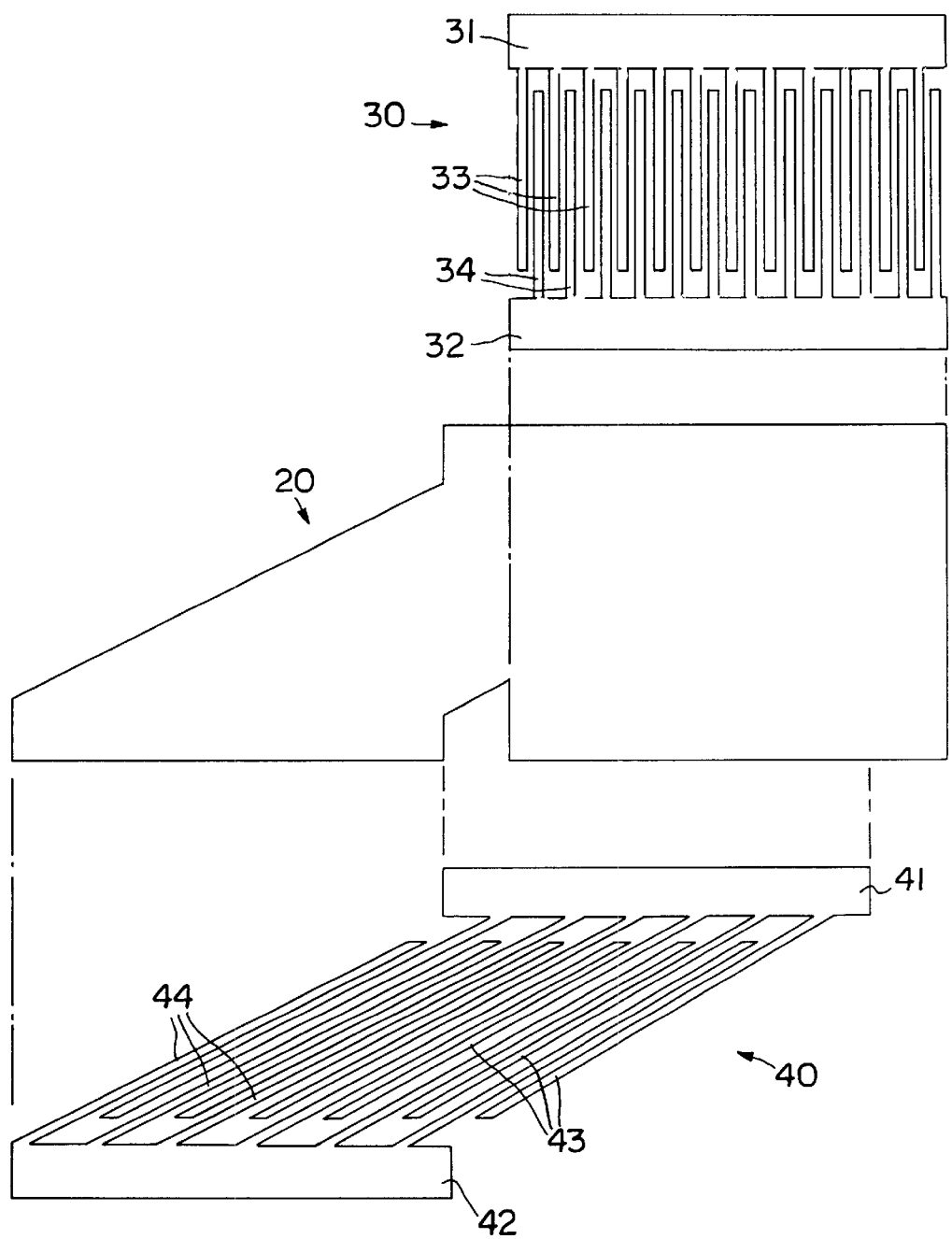
FIG. 5 is a layer diagram of a layered substrate for forming a double tuned birdcage coil structure.

FIG. 5 shows a layered structure from which the double tuned birdcage coil structure described above (as a subassembly of the coil structure 10 of FIG. 1) may be formed according to a method of this invention. This layered structure is formed by etching a substrate, known in the industry as "printed circuit substrate", consisting of laminated copper sheets 30 and 40 of approximately 0.001 to 0.005 inches thick on opposite surfaces of an insulating dielectric sheet 20 having thickness of 0.005 to 0.010 inches and being made of a glass-micro fiber-PTFE composite (such as produced by Rogers Corporation) and chemically etching the copper sheets 30 and 40 according to specified patterns and in a specified positional relationship with respect to each other. The first patterned copper sheet 30 has a rectangular ring-forming top part 31 and another rectangular ring-forming bottom part 32 separated from each other and facing opposite to each other, a plurality of mutually separated and parallel legs 33 protruding from the top part 31 towards the bottom part 32 without reaching it and an equal plural number of mutually separated and parallel legs 34 protruding from the bottom part 32 towards the top part 31 without reaching it so as to be together arranged in an interdigital formation, lying in one plane. The second patterned copper sheet 40 is of a somewhat similar structure, having a rectangular ring-forming top part 41 and a rectangular ring-forming bottom part 42 of the same shape as the top and bottom parts 31 and 32 of the first patterned sheet 30, the same plural number of mutually separated and parallel legs 43 protruding from the top part 41 towards the bottom part 42 without reaching it and as many mutually separated and parallel legs 44 protruding from the bottom part 42 towards the top part 41 without reaching it so as to be together arranged in an interdigital formation, lying in the same plane. (Ring-forming parts will be hereinafter referred to simply as "parts".) The top and bottom parts 41 and 42 of the second copper sheet 40, however, are not opposite to each other but one is displaced in the direction of its longer side edge with respect to the other by a distance equal to the length of its longer side edge. Their mutually parallel legs 43 and 44 are accordingly tilted, making a non-zero angle with the direction of the legs 33 and 34 of the first copper sheet 30, determined by the separation between the top part 41 and the bottom part 42 as well as the length of the longer edges of the rectangular top and bottom parts 31, 32, 41 and 42.

Figure 6A:
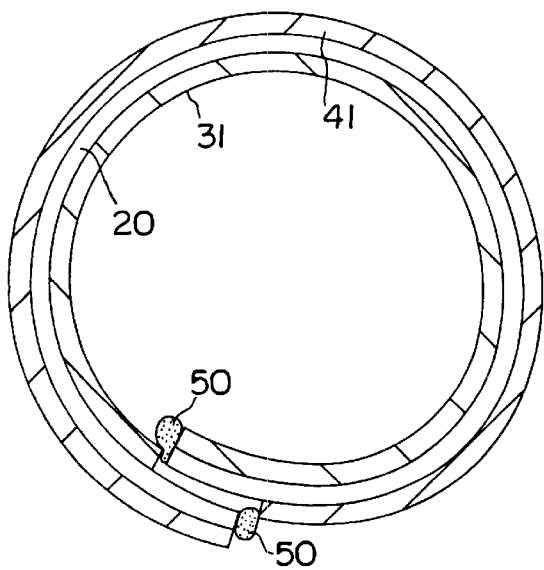
FIGS. 6A and 6B are axial views of the layered substrate of FIG. 5 being rolled into a cylindrical shape to form a double tuned birdcage coil structure embodying this invention.
Figure 6B:
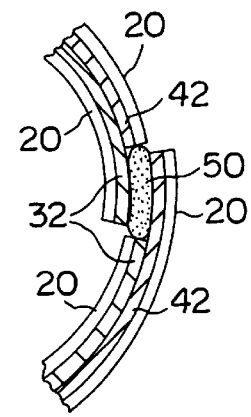

The two patterned copper sheets 30 and 40 on the mutually opposite surfaces of the dielectric sheet 20 are in the positional relationship as shown in FIG. 5, with the top parts 31 and 41 of the two patterned copper sheets 30 and 40 slightly displaced with respect to each other, as indicated by dotted lines. The printed circuit substrate thus formed is then rolled into a cylindrical form, as shown in FIGS. 6A and 6B, and both shorter edges of the rectangular top parts 31 and 41, as well as those of the rectangular bottom parts 32 and 42, are soldered together (indicted by numerals 50) such that the first patterned copper sheet 30 becomes a birdcage coil of a straight type (or a spiral coil with a zero twist angle). Thus, the legs 33 and 34 become the straight legs of the innermost coil 11 of the coil structure 10 shown in FIG. 1, and the legs 43 and 44 become the spiraling legs of its middle coil 12. It should be noted in FIG. 6B that the parts 32 and 42 come to a face-to-face contacting relationship so as to together form a single ring shared by both the innermost and middle coils 11 and 12, as the layered structured is rolled into the cylindrical form.

Figure 7:
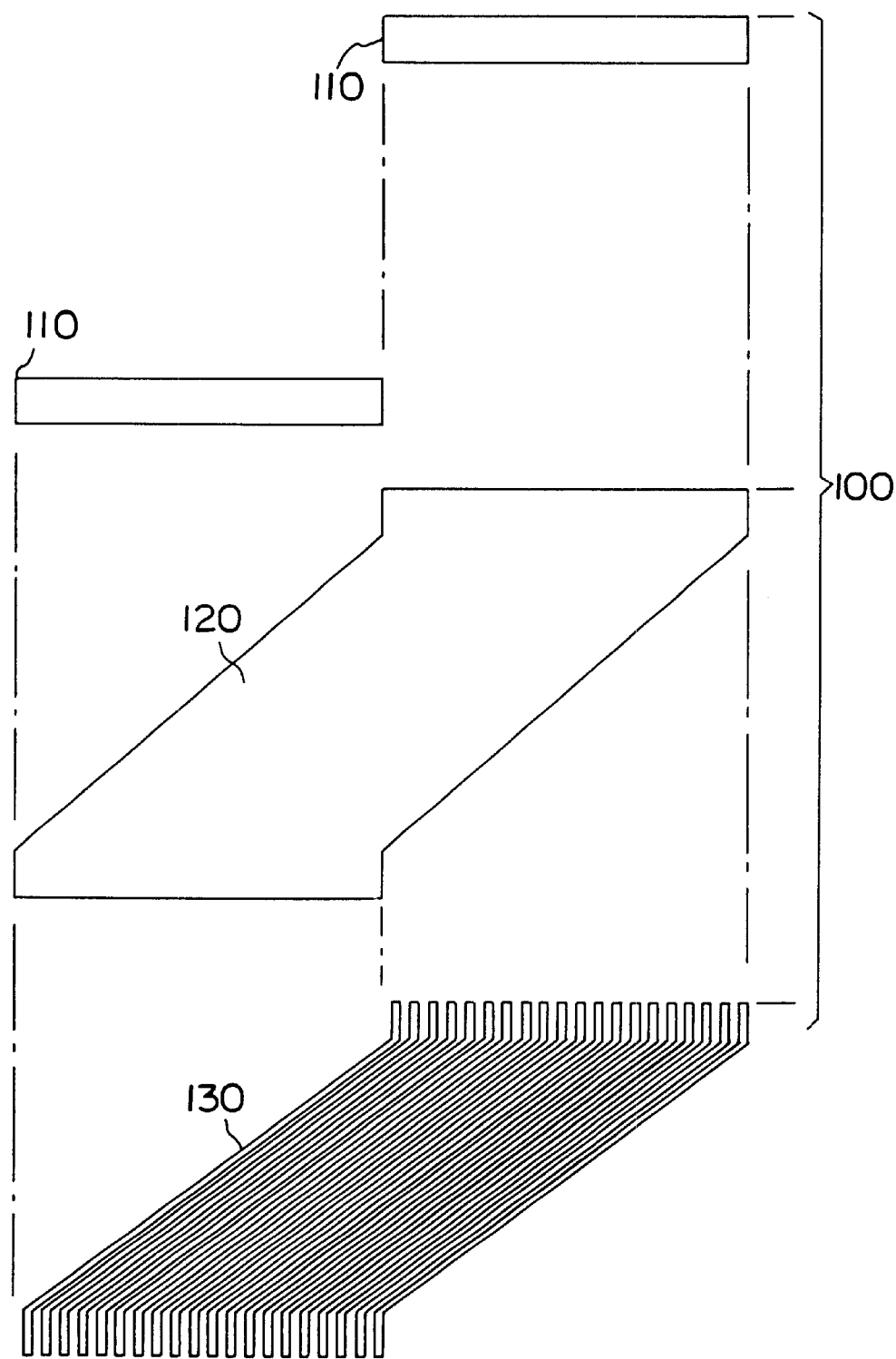
FIGS. 7, 8 and 9 are layer diagrams of layered substrates for producing birdcage coils by a method embodying this invention.

As explained above, either or both of the birdcage coils of double tuned birdcage coil structures according to this invention may be of a different structure, such as shown in FIGS. 2, 3 and 4. FIG. 7 shows a layer structure of a printed circuit substrate 100 from which a birdcage coil of the type shown in FIG. 4 may be formed by a method embodying this invention, having two rectangular metallic parts 110 positioned on one surface of an insulator plate 120 separated apart from each other and a plurality of mutually parallel linearly elongated metallic members 130 positioned on the opposite surface of the insulator plate 120, as shown by dotted lines, separated at equal intervals such that each end part of each of these elongated metallic members 130 is capacitively coupled to a corresponding one of the rectangular metallic parts 110 across the insulator plate 120. The layered structure 100 thus formed is rolled around into a cylindrical shape as explained above and the edges of the rectangular parts 110 are soldered together to form a birdcage coil as sketched in FIG. 4, each of the rectangular metallic parts 110 turning into one of the conductor rings of the coil and the elongated metallic members 130 turning into its legs each capacitively coupled to the conductor rings at both ends.

Figure 8:
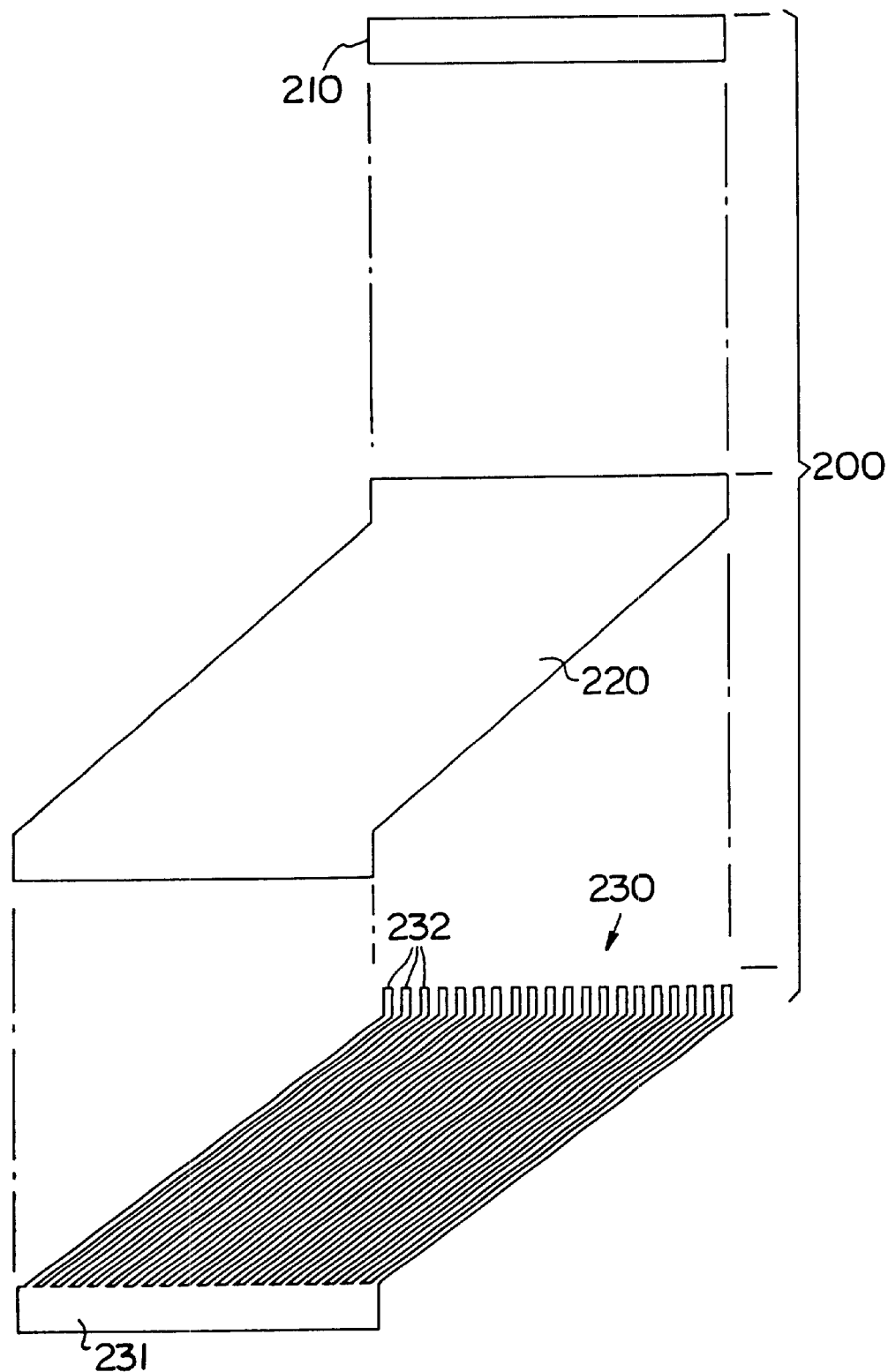

FIG. 8 shows the layer structure of another printed circuit substrate 200 from which a birdcage coil of the type shown in FIG. 3 may be formed by a method embodying this invention, having one rectangular metallic part 210 positioned on one surface of a rectangular insulator plate 220 along its larger side edge and a patterned metallic sheet 230 on the opposite surface of the insulator sheet 220, as shown by dotted lines. This patterned metallic sheet 230 is in the shape of a rectangular part 231 from which a plurality of linearly elongated members 232 protrude, extending mutually parallel and separated at equal intervals such that the end parts of these elongated members 232 are capacitively coupled to the rectangular metallic piece 210 on the opposite side of the insulator sheet 220. The printed circuit substrate 200 thus formed is rolled around into a cylindrical shape as explained above and the edges of the rectangular parts 210 and 231 are soldered together to form a birdcage coil as sketched in FIG. 3, each of the rectangular metallic members 210 and 231 turning into one of the conductor rings of the coil and the elongated metallic members 232 turning into its legs each directly connected to one of the conductor rings and capacitively coupled to the other of the conductor rings.

Figure 9:
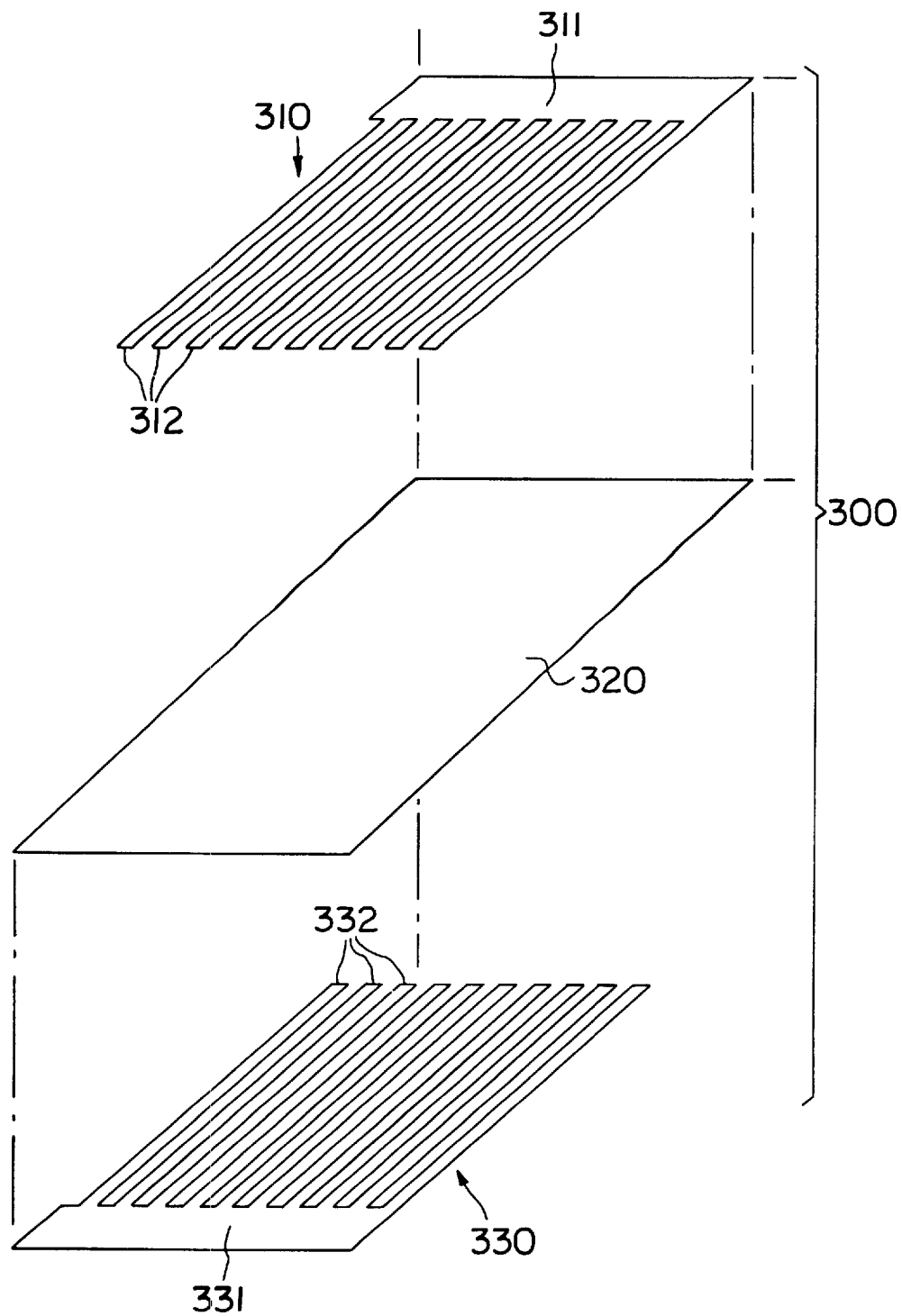

FIG. 9 shows the layer structure of still another printed circuit substrate 300 from which a birdcage coil of the type shown in FIG. 2 may be formed by a method embodying this invention, having two patterned metallic sheets 310 and 330 positioned on mutually opposite surfaces of an insulator sheet 320, as shown by dotted lines. These two patterned sheets 310 and 330 are similarly shaped, each having a rectangular part 311 or 331 from which a same plural number of mutually parallel and mutually separated linearly elongated members 312 or 332 protrude so as to together form partially overlapping and capacitively coupled pairs of legs across the insulator sheet 320. The printed circuit substrate 300 thus formed is rolled around into a cylindrical shape as explained above and the edges of the rectangular parts 311 and 331 are soldered together to form a birdcage coil as sketched in FIG. 2, the rectangular metallic parts 311 and 332 turning into its conductor rings and the elongated members 312 and 332 turning into capacitively coupled pairs of legs extending between the two conductor rings.

Although methods of producing birdcage coils with straight legs (with zero twist angle) have been illustrated in FIGS. 7, 8 and 9, it goes without saying that spiral birdcage coils with non-zero twist angles of the types sketched in FIGS. 2, 3 and 4 can be produced similarly by appropriately selecting the angle between the linearly elongated members which eventually turn into the legs and the rectangular parts which eventually turn into conductor rings.

Figure 10:
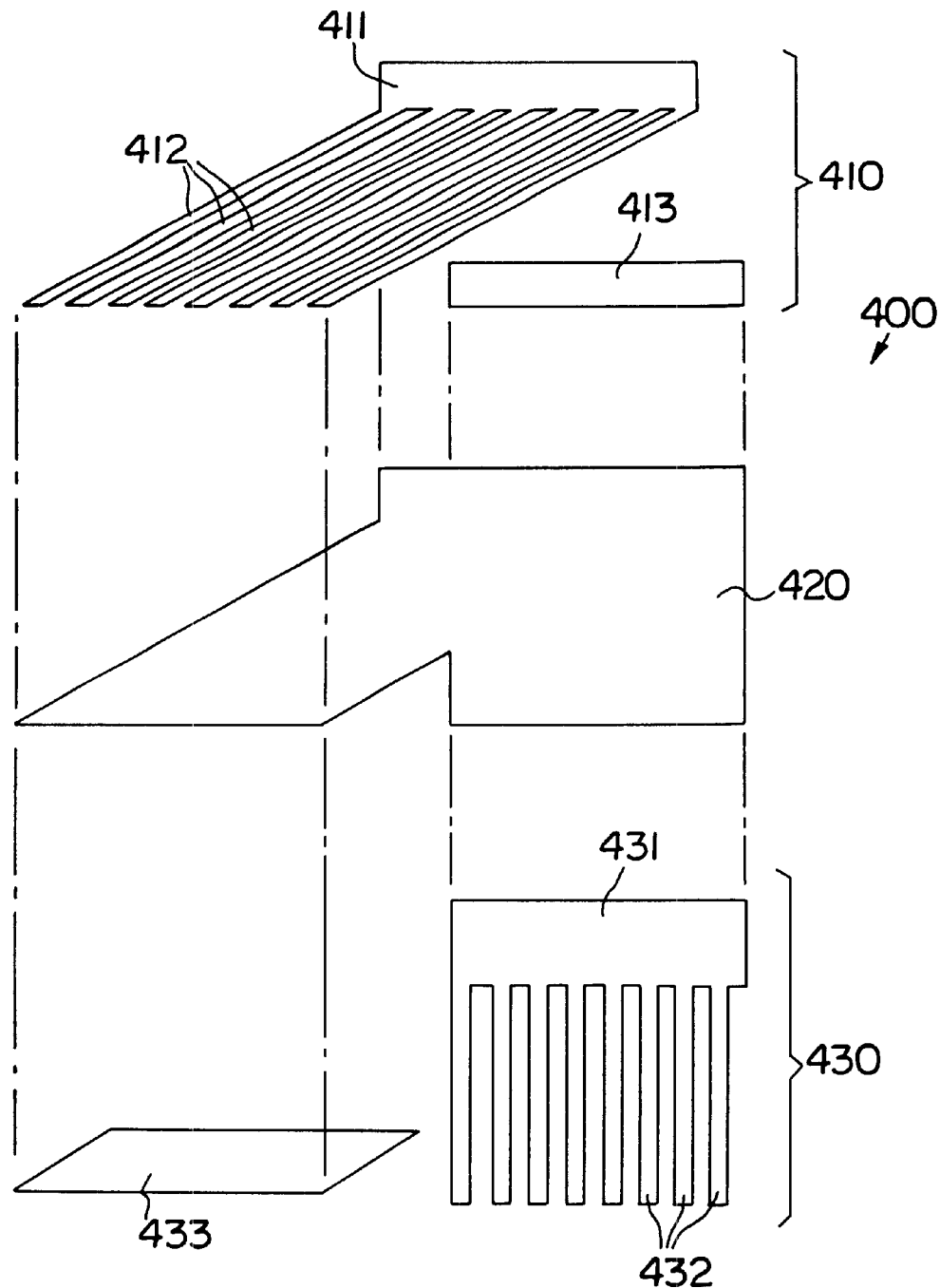
FIGS. 10, 11 and 12 are layer diagrams of layered substrates for producing double tuned birdcage coil structures by a method embodying this invention.

Additional examples of double tuned birdcage coil structure embodying this invention and methods of producing them will be presented next in order to demonstrate how the examples of the invention described above can be combined in a variety of different ways. FIG. 10 shows the layer structure of a printed circuit substrate 400 from which a double tuned birdcage coil structure with a straight birdcage coil and a spiral birdcage coil with twist angle of 360 degrees, both of the type shown in FIG. 3 and sharing a ring, may be formed by a method embodying this invention. The printed circuit substrate 400 has patterned metallic sheets 410 including a rectangular part 411 with a plurality of mutually parallel elongated members 412 protruding obliquely therefrom and another rectangular part 413 positioned apart from each other on one surface of an insulator sheet 420, as shown by dotted lines. Positioned apart from each other on the opposite surface of the insulator sheet 420 are patterned metallic sheets 430 including a rectangular part 431 with a plurality of mutually parallel elongated members 432 protruding perpendicularly therefrom and a part 433 in the shape of a parallelepiped with shorter edges parallel to the obliquely extending elongated members 412.

The printed circuit substrate 400 thus formed is rolled around into a cylindrical shape as explained above, and the shorter edges of the rectangular parts 411, 413 and 431 and the parallelepiped 433 are soldered together. As explained above with reference to FIG. 5, the parts 413 and 433 come to contact each other to together form a shared ring. The lengths of and the angle between the two sets of mutually parallel elongated members 412 and 432 are so determined that a double tuned birdcage coil structure with two birdcage coils of the type described above is thereby formed in a mutually coaxial relationship with one inside the other, having twist angles that are different from each other by 360 degrees. It is to be noted that the rectangular part 413 and the free end parts of the elongated members 432 are capacitively coupled and the parallelepiped part 433, with which the rectangular part 413 is in contact, and the free end parts of the obliquely elongated members 412 are also capacitively coupled.

Figure 11:
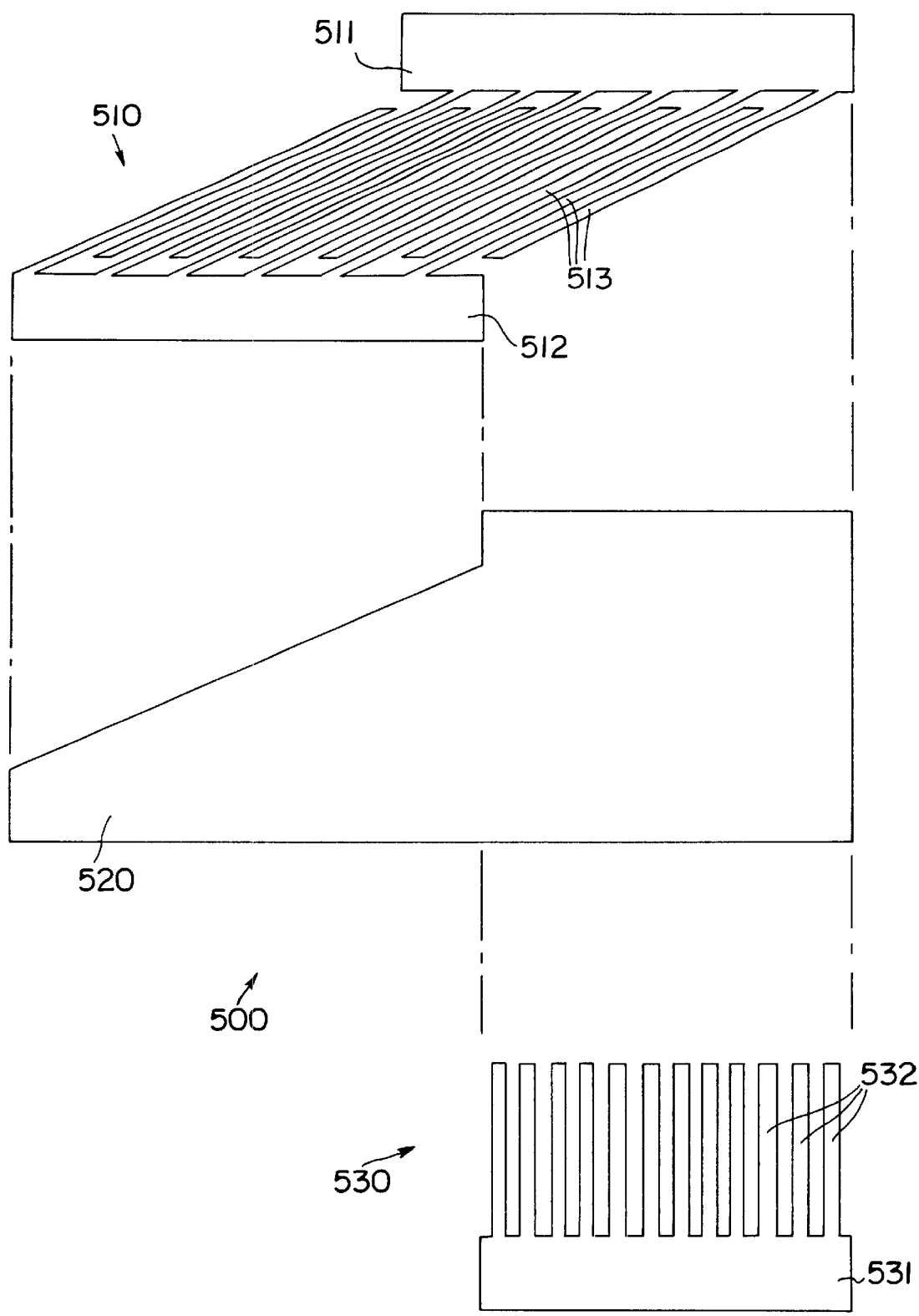

Two birdcage coils of different types may be assembled to form a double tuned birdcage coil assembly. FIG. 11 shows the layer structure of another printed circuit substrate 500 from which such a double tuned birdcage coil structure with a straight birdcage coil of the type shown in FIG. 3 and a spiral birdcage coil of the type shown in FIG. 1 with twist angle of 360 degree, may be formed by a method embodying this invention. The printed circuit substrate 500 has patterned metallic sheets 510 and 530 positioned as shown by dotted lines on mutually opposite surfaces of an insulating plate 520 shaped as shown. The first sheet 510 is patterned similar to the sheet shown at 40 in FIG. 5, having two rectangular parts 511 and 512 and a plurality of interdigitally arranged elongated metallic members 512 each obliquely protruding from either of the two rectangular parts 511 and 512 towards the other. The second sheet 530 is patterned similar to the part shown at 231 in FIG. 5, having a rectangular part 531 and a plurality of mutually parallel elongated members 532 protruding perpendicularly therefrom such that the free ends of these elongated members are capacitively coupled to the rectangular part 511 of the first sheet 510.

The printed circuit substrate 500 thus formed is rolled around into a cylindrical shape as explained above, contacting the parts 512 and 531 together, and the shorter edges of the rectangular parts 511, 512 and 531 are soldered together. The lengths of and the angle between the two sets of mutually parallel elongated members 513 and 532 are so determined that a double tuned birdcage coil structure embodying this invention can be formed with two birdcage coils which are in a mutually coaxial relationship with one inside the other, having twist angles that are different from each other by 360 degrees.

Figure 12:
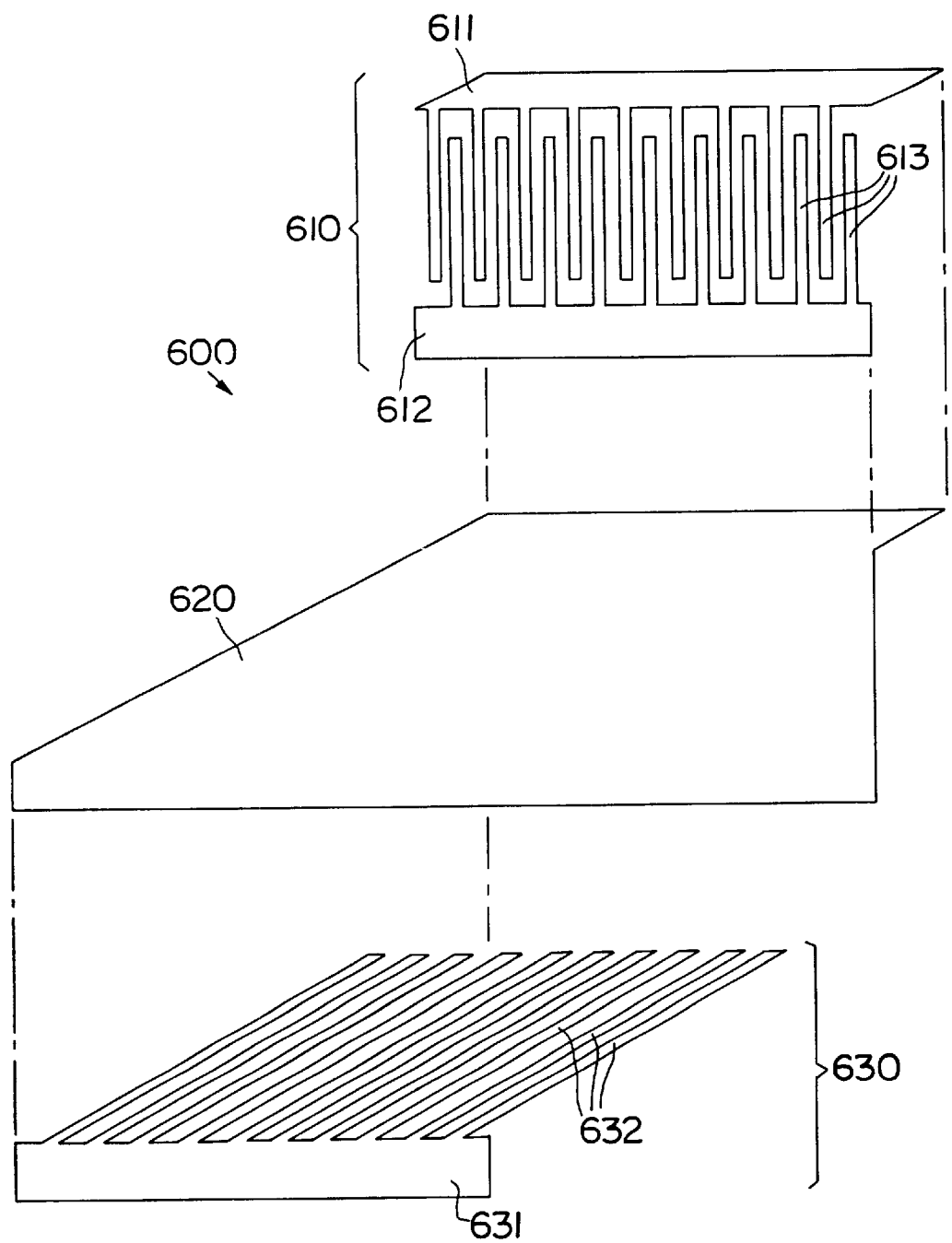

FIG. 12 shows the layer structure of still another printed circuit substrate 600 from which still another double tuned birdcage coil structure of a two-coil design may be formed by a method embodying this invention. This example may be considered a variation of the one explained above with referenced to FIG. 1, having two patterned metallic sheets 610 and 630 positioned on opposite surfaces of an insulating plate 620, as shown by dotted lines. The first sheet 610 includes a parallelepiped part 611 and a rectangular part 612 positioned opposite each other with their longer side edges parallel to each other and mutually separated linearly elongated members 613 protruding alternately therefrom towards each other in an interdigital formation. The second sheet 630 includes a rectangular part 631 and a plurality of mutually separated and parallel linearly elongated members protruding obliquely therefrom at the same angle as that of the parallelepiped 611.

The printed circuit substrate 600 thus formed is rolled around into a cylindrical shape explained above, contacting the parts 612 and 631 together and the shorter edges of the rectangular parts 612 and 631 and the parallelepiped 611 are soldered together. The lengths of and the angle between the two sets of mutually parallel elongated members 613 and 632 are so determined that,a double tuned birdcage coil structure embodying this invention can be formed with two birdcage coils which are in a mutually coaxial relationship with one inside the other, having twist angles that are different from each other by 360 degrees.

Methods of this invention were described above by way of only a limited number of examples but they are intended to be illustrative, not to limit the scope of the invention. The number of legs of each of birdcage coils for forming a multiple tuned birdcage coil may be varied and different from the illustrated examples. As explained above, furthermore, a large number of modifications and variations are possible and this is in part because each of the coils to be assembled may be any of the different types individually explained with reference to FIGS. 1, 2, 3 and 4 and in part because birdcage coils of the straight kind may, but need not, be included as one of the coils to be assembled. It is additionally to be noted that different ones of birdcage coils assembled together to form a multiple tuned birdcage coil structure according to this invention may share one or both of the rings, as explained above with reference to FIG. 5, although each of the assembled birdcage coils may have two unshared metallic rings of its own. Throughout herein, whenever legs of a birdcage coil are said to be connected to or capacitively couple to a ring, it is to be understood that the ring may be a shared kind or not.

It is further to be noted that although only low-pass coils were shown as examples of this invention, it goes without saying that this invention includes high-pass coils as well. Thus, the term "ring", too, is intended to be interpreted broadly, including not only continuously annular structure but also a plurality of conductor parts which are arranged in a ring formation as a whole, each mutually adjacent pair of them being capacitively coupled to each other.

In summary, the disclosure is intended to be interpreted broadly and all such modifications and variations that may be apparent to a person skilled in the art are intended to be within the scope of the invention, whether or not they are separately illustrated or described.

What is claimed is:

1. A multiple tuned resonant coil structure comprising:
   a plurality of birdcage coils is arranged coaxially around a central axis,
   each of said birdcage coils having two conductor rings separated from each other longitudinally along said central axis and
   a plurality of elongated conductor legs parallel therebetween and extending between said rings, said conductor legs being twisted around said central axis by a specified twist angle between said rings,
   said specified twist angle being different for each said coil by an integral multiple of 360 degrees,
   wherein said plurality of birdcage coils are mutually orthogonal, and inductively transparent.

2. The multiple tuned resonant coil structure of claim 1, wherein at least one of said birdcage coils has an upper ring and a lower ring and the legs of said at least one birdcage coil include downwardly extending legs which are equally spaced, attached to said upper ring and extend therefrom towards said lower ring and upwardly extending legs which are equally spaced, attached to said lower ring and attend therefrom towards said upper ring, said upwardly extending legs and said downwardly extending legs being arranged alternately around said central axis interdigitally.

3. The multiple tuned resonant coil structure of claim 1, wherein at least one of said birdcage coils has an upper ring and a lower ring, the legs of said at least one birdcage coil consists of downwardly extending legs which are equally spaced, attached to said upper ring and extend therefrom towards said lower ring and upwardly extending legs which are equally spaced, attached to said lover ring and extend therefrom towards said upper ring, each of said upwardly extending legs and a corresponding one of said downwardly extending legs being separated from, a radially overlapping positional relationship with respect to said central axis and capacitively coupled to each other.

4. The multiple tuned resonant coil structure of claim 1, wherein the legs of at least one of said birdcage coils are attached to one of said rings and capacitively coupled to the other of said rings.

5. The multiple tuned resonant coil structure of claim 1, wherein the legs of at least one of said birdcage coils extend between and are capacitively coupled at both ends to said two rings.

6. The multiple tuned, resonant coil structure of claim 1, wherein one of said rings is attached to the legs of one of said birdcage coils and capacitively coupled to the legs of another of said birdcage coils.

7. A method of providing a multiple tuned resonant coil structure, said method comprising the steps of:
   providing plurality of birdcage coils which are mutually differently tuned, each having two conductor ring separated from each other longitudinally along a central axis and a plurality of mutually separated and parallel linearly elongated conductor legs which extend between said rings, and generating B1 field which rotates around said central axis by a specified twist angle between said rings, the twist angles of different ones of said birdcage coils being different by an integral multiple of 360 degrees; and
   assembling said birdcage coils in a mutually coaxial and insulated relationship one inside another;
   wherein said plurality of birdcage coils are mutually orthogonal, being mutually inductively transparent.

8. The method of claim 7 further comprising the steps of providing a plurality of hollow cylindrical insulating bodies and assembling said insulating bodies and said birdcage coils together such that one of said insulating bodies is between each mutually adjacent pair of said coaxially assembled birdcage coils.

9. A method of providing a double tuned resonant coil structure having two birdcage coils arranged coaxially around a central axis, each of said birdcage coils having a plurality of mutually separated and parallel linearly elongated conductor legs extending between a first conductor ring and a second conductor ring which are separated from each other along said central axis, said method comprising the steps of:
   providing a printed circuit substrate comprising an insulating sheet with mutually opposite surfaces and metallic sheets laminated on both of said surfaces;
   etching said metallic sheets to form a first patterned conductive sheet on one of said surfaces and a second patterned conductive sheet on the other of said surfaces, said first patterned conductive sheet including a first set of plurality of mutually separated and parallel linearly elongated members, said patterned conductive sheet including a second set of plurality of mutually separated and parallel linearly elongated members;
   thereafter rolling said substrate into a cylindrical form around said central axis, at least one of the patterned conductive sheets including a first ring-forming part which, as said substrate is rolled, becomes at least a portion of said first ring, and at least one of the patterned conductive sheets including a second ring-forming part which, as said substrate is rolled, becomes at least a sheets including a second ring-forming part which, as said substrate is rolled, becomes at least a portion of said second ring; and soldering together portions of said first ring-forming part and portions of said second ring-forming part so as to form said first ring and said second ring, said first and second sets of linearly elongated members being designed so as to become said conductor legs of said two birdcage coils as said substrate is rolled such that each of said birdcage coils generates B1 field which rotates around said central axis by a specified twist angle between said first ring and said second ring, the twist angles of said two birdcage coils being different by an integral multiple of 360 degrees;

wherein said two birdcage coils are mutually orthogonal being inductively transparent to each other.

10. The method of claim 9 wherein said first set of linearly elongated members include downwardly extending legs and upwardly extending legs, said downwardly extending legs being directly connected to said first ring and extending towards said second ring, said upwardly extending legs being directly connected to said second ring and extending towards said first ring, said downwardly extending legs and said upwardly extending legs being arranged alternately in an interdigital configuration.

11. The method of claim 9 wherein said first set of linearly elongated members include downwardly extending legs and upwardly extending legs, said downwardly extending legs being directly connected to said first ring and extending towards said second ring, said upwardly extending legs being directly connected to said second ring and extending towards said first ring, each of said downwardly extending legs and a corresponding one of said upwardly extending legs being separated from each other, in a radially overlapping positional relationship with respect to said central axis and capacitively coupled to each other.

12. The method of claim 9 wherein each of said first set of elongated members is directly connected to said first ring and capacitively coupled to said second ring.

13. The method of claim 9 wherein each of said first set of elongated members is capacitively coupled to said first ring at one end and to said second ring at the other end.

14. The method of claim 9 wherein said first ring is directly connected to each of said first set of elongated members and capacitively coupled to each of said second set of elongated members.

15. A method of providing a birdcage coil having a central axis and generating B1 field which rotates by a specified twist angle around said central axis between a first conductive ring a second conductor ring which are mutually separated along said central axis; said method comprising the steps of:

providing printed circuit substrate comprising an insulating sheet with mutually opposite surfaces and patterned metallic sheets on at least one of said surfaces, said patterned metallic sheets including a first ring-forming part, a second ring-forming part and a set of plurality of mutually separated and parallel linearly elongated members extending between said first ring-forming part and said second ring-forming part;

thereafter rolling said substrate into a cylindrical form around said central axis, said first ring-forming part thereby forming said first ring, and said second ring-forming part thereby forming said second ring; and soldering together portions of said first ring-forming part and portions of said second ring-forming part so as to produce said first ring and said second ring, said elongated members being so designed as to thereby become helically spiraling legs of said birdcage coil generating B1 field with said specified twist angle between said first ring and said second ring.

16. The method of claim 15 wherein said elongated members include first members which protrude from said first ring-forming part and extend toward said second ring-forming part and second members which protrude from said second ring-forming part toward said first ring-forming part, said first members and said second members being arranged alternately in an interdigital configuration.

17. The method of claim 15 wherein said elongated members include first members which protrude from said first ring-forming part and extend toward said second ring-forming part and second members which protrude from said second ring-forming part toward said first ring-forming part, each of said first members and a corresponding one of said second members legs being mutually overlapping positional relationship on opposite ones of said surfaces of said substrate and being capacitively coupled to each other.

18. The method of claim 15 wherein said elongated members protrude from said first ring-forming part and extends toward said second ring-forming part, said elongated members and said first ring-forming part being on one of said surfaces of said substrate, and said second-ring forming part being on the other surface of said substrate.

19. The method of claim 15 wherein said elongated members are on one of said surfaces of said substrate and said first ring-forming part and said second ring-forming part are on the other of said surfaces.

* * * * *